(12) United States Patent
Slonim et al.

(10) Patent No.: US 8,010,924 B1
(45) Date of Patent: Aug. 30, 2011

(54) ASSIGNMENT OF SELECT INPUT/OUTPUT BLOCKS TO BANKS FOR INTEGRATED CIRCUITS USING INTEGER LINEAR PROGRAMMING WITH PROXIMITY OPTIMIZATION

(75) Inventors: Victor Z. Slonim, Broomfield, CO (US); Parivallal Kannan, Longmont, CO (US); Guenter Stenz, Longmont, CO (US)

(73) Assignee: Xilinx, Inc., San Jose, CA (US)

( * ) Notice: Subject to any disclaimer, the term of this patent is extended or adjusted under 35 U.S.C. 154(b) by 490 days.

(21) Appl. No.: 12/184,108

(22) Filed: Jul. 31, 2008

(51) Int. Cl.
*G06F 17/50* (2006.01)
(52) U.S. Cl. ............... 716/116; 716/121; 716/122
(58) Field of Classification Search ............ 16/116, 16/121–122; 716/116, 121–122
See application file for complete search history.

(56) References Cited

U.S. PATENT DOCUMENTS 6,289,496 B1 * 9/2001 Anderson et al. ............. 716/116
7,299,439 B1   11/2007 Slonim et al.
7,451,422 B1 * 11/2008 Slonim et al. ................ 716/138
7,480,884 B1 *  1/2009 Slonim et al. ................ 716/119

OTHER PUBLICATIONS

U.S. Appl. No. 11/501,155, filed Aug. 8, 2006, Slonim et al.
U.S. Appl. No. 11/500,524, filed Aug. 8, 2006, Slonim et al.
"Special Ordered Sets (SOS)", lp_solve 5.5.0.12 Reference Guide, downloaded Oct. 8, 2007 from http://lpsolve.sourceforge.net/5.5/SOS.htm, pp. 1-9.

* cited by examiner

Primary Examiner — Stacy A Whitmore
(74) Attorney, Agent, or Firm — Kevin T. Cuenot

(57) ABSTRACT

A method of assigning a plurality of input/output (I/O) objects of a circuit design to banks of a programmable integrated circuit (IC) using integer linear programming can include storing a plurality of constraints that depend upon a plurality of variables, wherein the plurality of constraints regulate assignment of each of the plurality of I/O objects to banks of the programmable IC (125-184), and storing a linear function that depends upon the plurality of constraints and a plurality of cost metrics, wherein each cost metric imposes a penalty when a selected I/O object of the circuit design is assigned to a bank of the programmable IC that is different from a bank to which the selected I/O object is assigned within a reference solution that is infeasible (190). A result indicating whether a feasible solution exists for assignment of the plurality of I/O objects of the circuit design to banks of the target programmable IC can be determined by minimizing the linear function (192) subject to the plurality of constraints and outputting the result (196, 198).

20 Claims, 5 Drawing Sheets

ASSIGNMENT OF SELECT INPUT/OUTPUT BLOCKS TO BANKS FOR INTEGRATED CIRCUITS USING INTEGER LINEAR PROGRAMMING WITH PROXIMITY OPTIMIZATION

FIELD OF THE INVENTION

The embodiments disclosed herein relate to integrated circuits. More particularly, the embodiments relate to the assignment of input/output objects to input/output banks of an integrated circuit.

BACKGROUND OF THE INVENTION

Modern integrated circuits (ICs) are capable of supporting a variety of different input/output (I/O) standards. Examples of I/O standards can include, but are not limited to, different varieties of Gunning Transceiver Logic (GTL) signaling such as GTL, GTL_DCI, and GTLP_DCI, Low Voltage Differential Signaling LVDS25, LVCMOS25, and the like. Each of these I/O standards specifies a set of attributes such as whether a reference voltage $V_{REF}$ is necessary, the value of any required $V_{REF}$, whether a voltage supply $V_{CC}$ is needed for input ($V_{CCI}$) or output ($V_{CCO}$), and/or the value of any required $V_{CCI}$ or $V_{CCO}$. This listing of I/O standards and attributes is not intended to be exhaustive, but rather illustrative of the many varieties of I/O standards and corresponding attributes that exist for use with ICs.

Most modern programmable ICs organize I/O objects of a circuit design into a limited number of physical I/O banks (banks) on the programmable IC. A programmable IC, such as a field programmable gate array (FPGA), can include 8 banks, although this number is not definitive of every type of programmable IC as different programmable ICs include different numbers of banks. In any case, each bank can be associated with a plurality of different I/O objects. The I/O objects that are assigned to a given bank must be configured according to compatible I/O standards. As such, the placement of I/O objects into a given bank can be said to be constrained by the organization of that bank. In illustration, some I/O standards require a specific $V_{CCI}$ or $V_{CCO}$. A bank typically has a single $V_{CC}$ supply. Accordingly, only I/O objects configured according to I/O standards that have compatible $V_{CC}$ requirements can be assigned to the same bank. Other attributes of I/O standards may further restrict the set of banks to which a given I/O object can be assigned.

The task of assigning I/O objects to banks is commonly referred to as the "Select I/O placement problem." Past techniques for solving the Select I/O placement problem have relied upon heuristics to automate I/O placement. One heuristic-based approach utilizes a combination of simulated annealing, bipartite matching, and constructive bin-packing to find a solution. Heuristic-based techniques, however, do have disadvantages. In particular, heuristic-driven techniques are not guaranteed to determine a feasible I/O placement solution despite the existence of such a solution. Further, heuristic techniques are not capable of identifying an inherently infeasible circuit design.

Another proposed solution for the I/O placement problem relies upon an Integer Linear Programming (ILP) formulation of the problem. This solution seeks to overcome the uncertainties of heuristic approaches discussed above. While a feasible solution to the Select I/O placement problem may be found through the use of ILP, such a solution typically is not optimal in terms of wire length or other metrics that may be used to determine the quality of the solution. The most optimal solution in terms of selected quality metrics, however, typically is not a feasible solution. That is, an optimal solution will typically locate I/O objects with conflicting I/O standards within the same bank.

SUMMARY OF THE INVENTION

The embodiments disclosed herein relate to the assignment of input/output (I/O) objects to banks of a programmable integrated circuit (IC). One embodiment of the present invention can include a computer-implemented method of assigning a plurality of I/O objects of a circuit design to banks of a programmable IC using integer linear programming. The method can include storing a plurality of constraints that depend upon a plurality of variables. The plurality of constraints can regulate assignment of each of the plurality of I/O objects to banks of the programmable IC. A linear function that depends upon the plurality of constraints and a plurality of cost metrics can be stored. Each cost metric can impose a penalty when a selected I/O object of the circuit design is assigned to a bank of the programmable IC that is different from a bank to which the selected I/O object is assigned within a reference solution that is infeasible. A result indicating whether a feasible solution exists for assignment of the plurality of I/O objects of the circuit design to banks of the target programmable IC can be determined by minimizing the linear function subject to the plurality of constraints. The result can be output.

Storing a plurality of constraints can include assigning each of the plurality of I/O objects to a group according to an I/O standard implemented by each I/O object, wherein only I/O objects of compatible groups are assigned to a same bank of the programmable IC. A plurality of grouped I/O object assignment variables can be determined. Each of the plurality of grouped I/O object assignment variables can be a binary variable representing one selected I/O object and the group to which the one selected I/O object is assigned. Each grouped I/O object assignment variable can indicate whether the one selected I/O object represented by the grouped I/O assignment variable is assigned to a selected bank of the programmable IC. When the result indicates a feasible solution, each of the plurality of I/O objects can be assigned to a bank of the programmable IC according to the plurality of grouped I/O object assignment variables.

Storing a linear function can include selecting each cost metric to depend upon distance between the bank of the programmable IC to which the selected I/O object for the circuit design is assigned and the bank of the programmable IC to which the selected I/O object is assigned in the reference solution.

The linear function can be selected to be $$\sum_{i=1}^{M}\sum_{j=1}^{N_i}\sum_{p=1}^{N}\sum_{q=1}^{N} X_{ijp} D_{pq} R_{ijq},$$

wherein $X_{ijp}$ is a binary variable indicating whether an I/O object j that is assigned to a group i is assigned to a bank p of the programmable IC, $D_{pq}$ is a constant that represents a distance between a bank p and a bank q of the programmable IC, $R_{ijq}$ is a binary variable that indicates whether I/O object j of group i is assigned to bank q in the reference solution, $N_i$ is the size of a set of I/O objects assigned to a group i, M is a total number of groups, and N is a total number of banks on the programmable IC.

Another embodiment of the present invention can include a computer-implemented method of assigning a plurality of I/O objects of a circuit design to banks of a programmable IC using integer linear programming. The method can include storing a plurality of constraints that depend upon a plurality of variables. The plurality of constraints can regulate assignment of each of the plurality of I/O objects to banks of the programmable IC. A reference solution specifying assignments of I/O objects to banks of the programmable IC can be selected. The reference solution can be infeasible. A linear function can be stored. The linear function can depend upon the plurality of constraints and cost metrics that penalize assignment of I/O objects of the circuit design to banks of the programmable IC that differs from the assignment of I/O objects to banks of the programmable IC within the reference solution. A feasible solution can be determined to exist for the assignment of the plurality of I/O objects of the circuit design to banks of the programmable IC when the linear function can be minimized while satisfying each of the plurality of constraints. When a feasible solution exists, the feasible solution specifying an assignment of each of the plurality of I/O objects to banks of the programmable IC can be output.

Storing a linear function can include selecting each cost metric to depend upon distance between the bank of the programmable IC to which a selected I/O object of the circuit design is assigned and the bank of the programmable IC to which the selected I/O object is assigned in the reference solution. Storing a linear function also can include selecting each cost metric to depend upon a difference in timing that results from assigning a selected I/O object to a bank of the programmable IC that is different from the bank to which the selected I/O object is assigned in the reference solution. Storing a linear function further can include selecting each cost metric to depend upon a difference between a wire length of a route beginning at a selected location within the programmable IC and ending at the bank of the programmable IC to which a selected I/O object of the circuit design is assigned and a wire length of a route beginning at the selected location within the programmable IC and ending at the bank of the programmable IC to which the selected I/O object is assigned in the reference solution.

Storing a plurality of linear relationships can include assigning each of the plurality of I/O objects to a group according to an I/O standard implemented by each I/O object, wherein only I/O objects of compatible groups are assigned to a same bank of the programmable IC. The method also can include defining a plurality of grouped I/O object assignment variables $X_{ijp}$, wherein each of the plurality of grouped I/O object assignment variables is a binary variable representing one selected I/O object j and the group i to which the one selected I/O object is assigned. Each grouped I/O object assignment variable can indicate whether the one selected I/O object represented by the grouped I/O object assignment variable is assigned to a selected bank p of the programmable IC. When a feasible solution exists, each of the plurality of I/O objects can be assigned to a bank of the programmable IC according to the plurality of grouped I/O object assignment variables.

The method further can include selecting the linear function to be $$\sum_{i=1}^{M} \sum_{j=1}^{N_i} \sum_{p=1}^{N} \sum_{q=1}^{N} X_{ijp} D_{pq} R_{ijq},$$

wherein $D_{pq}$ is a constant that represents a distance between a bank p and a bank q of the programmable IC, $R_{ijq}$ is a binary variable that indicates whether I/O object j of group i is assigned to bank q in the reference solution, $N_i$ is the size of a set of I/O objects assigned to a group i, M is a total number of groups, and N is a total number of banks on the programmable IC.

Yet another embodiment of the present invention can include a computer program product including a computer-usable medium having computer-usable program code that, when executed by a data processing system, causes the data processing system to perform the various steps and/or functions disclosed herein.

DETAILED DESCRIPTION

Figure 1A:
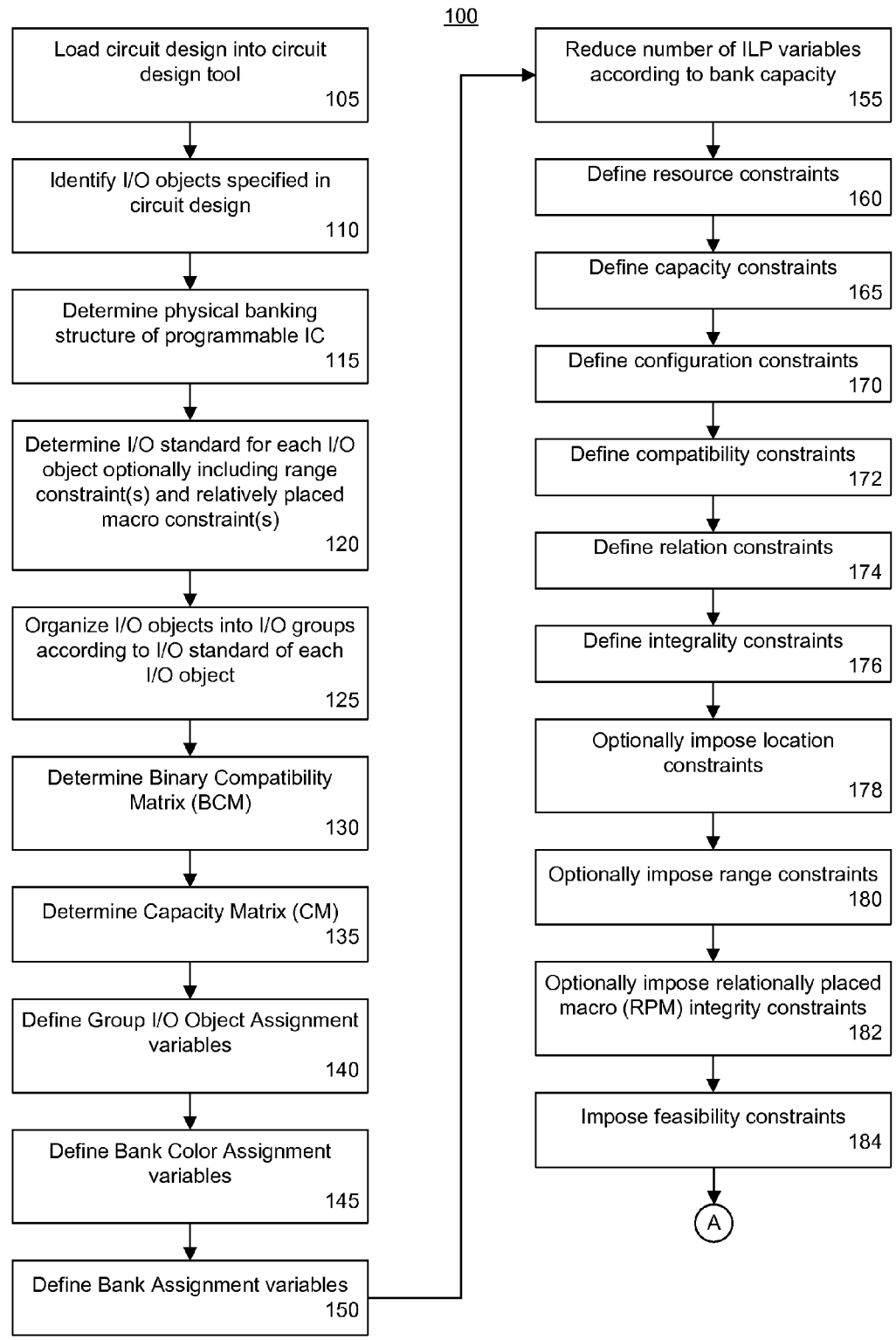
FIGS. 1A and 1B, taken collectively, form a flow chart illustrating a method of determining the feasibility of input/output object placement for a circuit design for a programmable integrated circuit (IC) in accordance with one embodiment of the present invention.

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting but rather to provide an understandable description of the invention.

The embodiments disclosed herein relate to assigning input/output (I/O) objects of a circuit design to banks of a programmable integrated circuit (IC). More particularly, the embodiments relate to solving Select I/O placement problems for a wide variety of I/O objects. In some cases, an optimized solution for the Select I/O placement problem can be generated or is otherwise available. This solution typically is optimized with respect to any of a variety of different parameters such as wire length, timing, other parameters, or some combination of parameters. Typically, the optimized solution is not a feasible solution. That is, the optimized solution that assigns one or more I/O objects to banks of a target programmable IC frequently violates some constraint.

In accordance with the embodiments disclosed herein, the feasibility of a given circuit design can be determined with respect to the Select I/O placement problem using an Integer Linear Programming (ILP) formulation. When a feasible solution does exist, a reference solution can be incorporated into the solution process. The reference solution can be an assignment of I/O objects to banks of the target programmable IC that has been optimized with respect to one or more parameters. When the reference solution is not a feasible solution, the ILP formulation can be changed to incorporate the reference solution. The resulting solution determined from the ILP formulation will be one that is close to, or approximates, the reference solution without violating any of the established constraints that are to be followed in assigning I/O objects to banks. The resulting solution, e.g., a mapping or assignment of I/O objects to banks of the programmable IC, can be output.

Including optimization objectives directly within an ILP formulation of the Select I/O problem can introduce non-linearity into the ILP formulation. This non-linearity can make finding a solution difficult. The embodiments disclosed herein incorporate one or more possible optimizations into the ILP formulation. The optimization(s) are linear in nature and, therefore, do not complicate the ILP formulation. These optimizations facilitate finding a feasible solution for the Select I/O problem that does not violate any defined constraints and that is close to the reference design. That is, the solution will not include any large or significant perturbations of the reference design. Accordingly, a legal assignment of I/O objects to banks can be found that is not a significant departure from the reference solution or that is as close to the reference solution as is possible without violating any constraints.

Programmable ICs are a well known type of IC that can be programmed to perform specified logic functions. One type of programmable IC, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable ICs, the functionality of the device is controlled by data bits, e.g. a "bitstream," that is loaded into, or provided to, the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other programmable ICs are programmed by applying a processing layer, such as a metal layer, that programmably interconnects the various elements on the device. These programmable ICs are known as mask programmable devices. Programmable ICs can also be implemented in other ways, e.g., using fuse or antifuse technology. The term "programmable IC" can include, but is not limited to, these exemplary devices and can encompass devices that are only partially programmable. For example, one type of programmable IC includes a combination of hard-coded transistor logic and a programmable switch fabric that programmably interconnects the hard-coded transistor logic.

The embodiments described herein can be implemented in the form of computer program code executing within one or more data processing systems. A "circuit design tool" or "system," as used herein, can refer to one or more data processing systems executing such computer program code to perform the various steps and/or functions described within this specification. The system can operate upon software-based, or programmatic, representations of circuit designs including, but not limited to, netlists, hardware description language representations, or, in some cases, high level programming language representations (hereafter collectively referred to as a "circuit design").

Figure 1B:
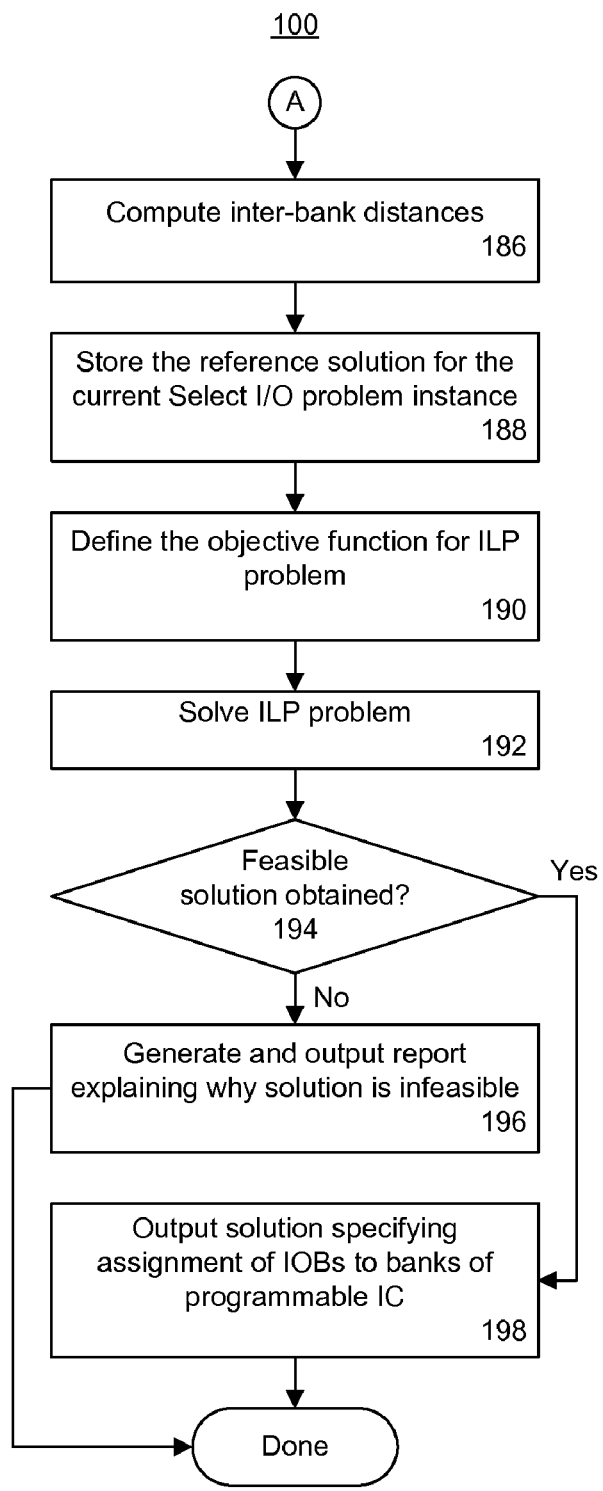

FIGS. 1A and 1B, taken collectively, form a flow chart illustrating a method 100 of determining the feasibility of I/O object placement for a circuit design for a programmable IC in accordance with one embodiment of the present invention. Beginning in step 105, a circuit design for a programmable IC can be loaded into a system as described above. While the circuit design can be for any of a variety of different programmable ICs, in one embodiment, the circuit design can be for an FPGA. In step 110, the system can identify various I/O objects specified, or defined, by the circuit design. As used herein, an I/O object can refer to an I/O instance, such as an IOB, in the loaded circuit design. In order for the circuit design to function properly within the programmable IC, each I/O object of the circuit design must be assigned to a particular I/O bank (bank) of the programmable IC.

In step 115, the system can determine the physical banking structure of the programmable IC in which the circuit design will be implemented, or loaded. The programmable IC within which the circuit design will be implemented can be referred to as the "target programmable IC" or the "target device." Modern programmable ICs typically provide multiple banks for grouping I/O sites as has been noted. Each bank, denoted as $B_P$, where p=1, . . . , N and N is the total number of banks on the IC, can be characterized by a set of resources, or parameters. These parameters collectively define the banking architecture of the programmable IC and can be ascertained, or known, by identifying the particular type, e.g., brand and/or model, of programmable IC within which the circuit design is to be implemented. In any case, these parameters can include, but are not limited to, the number of regular I/O pins, denoted as $N_{reg}$, in each bank; the number of special $V_{ref}$ pins, denoted as $N_{vref}$, in each bank; and the number of special $V_r$ pins, denoted as $N_{vr}$, in each bank.

Regular I/O pins can be used to provide signals to I/O objects. By comparison, special pins, in reference to $V_{ref}$ and $V_r$ pins, can be used to supply additional resources to I/O objects assigned to the bank(s) in which such pins reside. $V_{ref}$ and $V_r$ pins can have a feature which allows the pins to function as regular I/O pins if the I/O objects assigned to the bank do not require a specific reference voltage or special termination type such as SPLIT, SINGLE, or DRIVER. The flexible nature of the special pins can lead to situations in which banks have different capacities depending upon which I/O objects and corresponding standards have been assigned to the bank.

In general, step 115 determines an upper boundary of the capacity for each bank. For example, an optimal configuration for the banks can be determined. To satisfy the number of I/Os required and specified constraints for a bank, $V_{ref}$ and $V_r$ pins can automatically be selected for use as special purpose pins or as regular I/O pins. Step 115 effectively enumerates the number of special pins in each bank, from which a capacity of the bank can be determined.

In step 120, the particular I/O standard, denoted as $S_i$, to which each I/O object identified in step 110 is to conform can be determined. The I/O standard corresponding to each I/O object can be extracted, or ascertained, from an examination of the circuit design or obtained from the user. As noted, an I/O standard defines the set of properties or attributes that any I/O object must possess if considered to conform to that I/O standard. Examples of common I/O standards can include, but are not limited to, LVCMOS25, LVDS25, PCI33_3, GTL, GTL_DCI, GTLP_DCI, HSTL_I_D, LVDCI_18, and LVDCI_33. This listing is not intended to be exhaustive, but rather serve as an illustration of the many different I/O standards that are available that dictate the parameters associated with an I/O object.

Each I/O standard $S_i$ can dictate a set of parameters as well as the values assigned to those parameters. By classifying an I/O object as corresponding, or belonging, to a particular I/O standard, the I/O object can be associated with the attributes and attribute values corresponding to that I/O standard. In one embodiment, a non-exhaustive list of the attributes defined by an I/O standard can include, for example, I/O Standard Name, Reference Voltage ($V_{REF}$), Output Voltage ($V_{CCO}$), Termination Type, and Direction Type. Possible values for Termination Type can include, for example, SPLIT, SINGLE, DRIVER, and NONE. Possible values for Direction Type can include, for example, INPUT, OUTPUT, and BIDIRECTIONAL.

Table 1 below provides a listing of exemplary attributes and attribute values for different I/O standards. The letters "NR," as used herein, stand for "not relevant" and indicate the ability of a given I/O standard to accommodate a variety of different values for a specified attribute.

TABLE 1

| I/O Standard Name | $V_{REF}$ (Volts) | $V_{CCO}$ (Volts) | $V_{CCO}$ (Volts) | Termination Type |
|---|---|---|---|---|
| LVCMOS25 | NR | 2.5 | 2.5 | NR |
| LVDS25 | NR | NR | 2.5 | NR |
| PCI33_3 | NR | 3.3 | 3.3 | NR |
| GTL | 0.8 | NR | NR | NR |
| GTL_DCI | 0.8 | 1.2 | 1.2 | Single |
| GTLP_DCI | 1.0 | 1.5 | 1.5 | Single |
| HSTL_I_D | 0.75 | 1.5 | 1.5 | Split |
| LVDCI_18 | NR | NR | 1.8 | Driver |
| LVDCI_33 | NR | NR | 3.3 | Driver |

Clock I/O objects can be assigned to only those banks that have dedicated clock I/O sites. In one embodiment, this can be accomplished by using range constraints for all of the clock I/O objects. A range constraint can specify those banks that can accommodate a clock I/O object. In one embodiment, a range constraint can specify at least one rectangular region on the programmable IC. For example, the region can be an area that includes at least a portion of one or more banks on the programmable IC having clock I/O sites.

Thus, in another embodiment, the set of attributes defined by an I/O standard $S_i$ further can include a range constraint type, denoted as RCType, and a relationally placed macro (RPM) constraint type, denoted as RPMType. I/O objects, including clock I/O objects, can be characterized by a set of associated rectangular windows defined on the target programmable IC. Each rectangular window can define an area on the target programmable IC where a given I/O object can be placed. This effectively limits the available sites to which the I/O object can be located to those within the rectangular windows.

The rectangular windows can be created to accommodate a variety of design constraints including, for example, timing requirements, congestion, or other user imposed constraints. If a given I/O object is associated with more than one rectangular window, the available sites to which that I/O object can be located are those sites located within the union of the rectangular windows associated with that I/O object. The available sites, being located within particular banks of the programmable IC, effectively define a range, or set, of banks that are available to host a given I/O object.

The set of available banks can be expressed as the range constraint RCType. The RCType can identify a distinct range constraint for the circuit design. RCType can identify the set of banks allowed to host a given I/O object that has a range constraint corresponding to RCType. If RCType is assigned a value of zero for a given I/O standard $S_i$, the I/O objects of that I/O standard can be assigned to any bank on the target device.

If assignment of an I/O standard will be restricted to a set of banks of the target device, the RCType for that I/O standard can be assigned some positive integer. The positive integer number can be an index number that identifies the set of banks of the target device to which I/O objects of the I/O standard $S_i$ can be assigned. In the case where two I/O standards have different RCTypes, each I/O standard can be considered to be completely disjoint from the other.

The RPMType can specify the number of I/O objects included as part of an RPM group. An RPM, as used herein, can refer to a set of components and/or blocks of a circuit design that have predetermined, relative coordinates with respect to one another. The collection of components forming the RPM can be moved and treated as a single, larger component. In terms of banks of a target device, one constraint, e.g., an RPM constraint, may specify that the I/O objects of an RPM must be assigned to the same bank, without being separated. The splitting of I/O objects of an RPM to different banks is not permitted. Accordingly, a default value of one can be assigned to the RPMType parameter for single I/O objects that are not included within an RPM. Many I/O related RPMs, such as LVDS pairs, have an RPMType equal to 2. Only the I/O objects with the same RPMType can be combined to form a group.

The parameters listed herein in relation to I/O standards are not intended to limit the present invention. Additional parameters and/or parameter values can be used, or incorporated, as new architectures evolve.

Identifying the I/O standard for the I/O objects of the circuit design is useful in determining the feasibility of a circuit design with respect to the I/O placement solution. The attributes of the I/O objects, as dictated by the I/O standard for each I/O object, can be taken into consideration. Compatibility rules, or constraints, relating to the placement of I/O objects can be specified based upon the set of parameters for each of the I/O standards. These constraints can indicate whether I/O objects of given I/O standards can be placed within a same bank of the IC. I/O objects placed within a same bank should have same or compatible attributes, for example voltage requirements. These attributes should not conflict with one another.

In step 125, I/O objects of the circuit design can be organized into groups according to the I/O standard of each respective I/O object. Each group can represent one or more I/O objects that should obey a similar set of compatibility constraints. In one embodiment, each group, denoted as $G_i$, can be defined as the set $G_i=\{S_i,\{O_{ij}\}\}$, where $j=1, \ldots, N_i$ and $i=1, \ldots, M$. In this expression, M represents the total number of groups for the circuit design and $\{O_{ij}\}$ represents the set of I/O objects that form the group $G_i$. $N_i$ refers to the size of the set $\{O_{ij}\}$. From the discussion relating to RCType and RPMType above, it should be appreciated that any group can include only I/O objects that have the same I/O standard. Accordingly, each group will include only I/O objects having the same RCType and the same RPMType.

In step 130, a Binary Compatibility Matrix (BCM) can be determined. In one embodiment, the BCM can be generated according to those I/O standards identified in the circuit design that is being processed. In another embodiment, the BCM can be predetermined and stored as a lookup table or other data structure as the attributes of many I/O standards are known in advance and are readily available.

The BCM can be implemented as a matrix having a plurality of elements $A_{ij}$. Each element $A_{ij}$ can indicate the compatibility of one group $G_i$ with respect to another group $G_j$. If $A_{ij}=1$, the corresponding groups are said to be compatible and can be placed in a same bank of the programmable IC. As discussed, compatibility among different groups is directly related to the individual attributes of each I/O standard.

The BCM can be formulated by observing a plurality of rules pertaining to I/O standard compatibility. For example, one rule can be that the voltages needed for $V_{REF}$ and $V_{CC}$ that are required by a given I/O standard must be compatible if I/O objects of the two I/O standards are to be placed in a same bank. That is, all I/O objects assigned to a same bank must correspond to an I/O standard having the same fixed $V_{REF}$ and $V_{CC}$ requirements or to an I/O standard that has an undefined value, e.g., denoted as "NR" in Table 1.

When considering compatibility within banks, another rule can account for the direction of I/O objects. I/O objects programmed bi-directionally, which use both input and output buffers, use an I/O standard that allows for bi-directional programming. Depending upon the direction, some attributes, such as $V_{REF}$ or $V_{CCO}$ voltage or terminate types, may be different. Accordingly, such a rule can specify which I/O objects may be placed within a same bank based upon the direction of the I/O objects.

Another rule can be that the terminate type also must be compatible within the same bank. For example, within some types of programmable ICs, only one I/O standard having a terminate type of SINGLE can be programmed per bank. Only one I/O standard having a terminate type of SPLIT can be programmed per bank. Terminate types of SINGLE and SPLIT can co-exist in a same bank. Terminate types NONE and DRIVER are not restricted to being the only terminate type within a given bank. Thus, terminate types NONE and DRIVER can co-exist with types SPLIT and SINGLE.

Using these rules as described above, it can be seen that $A_{ij}=0$ indicating that group $G_i$ is not compatible with group $G_j$ if the following constraints are met. If groups $G_i$ and $G_j$ require different definite values for $V_{REF}$ and/or $V_{CC}$, then $A_{ij}=0$. If groups $G_i$ and $G_j$ have different I/O standards and both require special termination types of SINGLE or SPLIT, then $A_{ij}=0$.

For purposes of illustration, Table 2 below shows an example of a compatibility matrix indicating the compatibility of some known I/O standards.

TABLE 2

|  | LVCMOS25 | LVDS25 | PCI33_3 | GTL | GTL_DCI | GTLP_DCI | HSTL_I_D | LVDCI_18 | LVDCI_33 |
|---|---|---|---|---|---|---|---|---|---|
| LVCMOS25 | 1 | 1 | 0 | 1 | 0 | 0 | 0 | 0 | 0 |
| LVDS25 | 1 | 1 | 0 | 1 | 0 | 0 | 0 | 0 | 0 |
| PCI33_3 | 0 | 0 | 1 | 1 | 0 | 0 | 0 | 0 | 1 |
| GTL | 1 | 1 | 1 | 1 | 1 | 0 | 0 | 0 | 1 |
| GTL_DCI | 0 | 0 | 0 | 1 | 1 | 0 | 0 | 0 | 0 |
| GTLP_DCI | 0 | 0 | 0 | 0 | 0 | 1 | 0 | 0 | 0 |
| HSTL_I_D | 0 | 0 | 0 | 0 | 0 | 0 | 1 | 0 | 0 |
| LVDCI_18 | 0 | 0 | 0 | 0 | 0 | 0 | 0 | 1 | 0 |
| LVDCI_33 | 0 | 0 | 1 | 1 | 0 | 0 | 0 | 0 | 1 |

In step 135, a Capacity Matrix (CM) can be determined. The CM can include a plurality of elements with each element being denoted as $C_{ip}$. Each element of the CM can indicate a maximum number of I/O objects from a given group $G_i$ that can be assigned to a given bank $B_p$. The CM can be defined such that each element is a positive integer. The value of the integer can differ for each bank. By allowing each element $C_{ip}$ to differ, flexibility is added as each bank need not be assumed to have the same capacity.

The CM can also facilitate the imposition of other constraints on I/O object placement with regard to limiting the available banks to which selected I/O objects can be assigned. Assigning a value of zero to the appropriate CM element effectively makes a given bank unavailable to a particular group. In illustration, if a given bank $B_p$ lacks a $V_{ref}$ pin or a $V_r$ pin, the bank $B_p$ cannot support I/O objects that require specific values for these parameters ($V_{ref}$ and $V_r$). In such cases, the bank capacity $C_{ip}$ of that bank can be set to zero indicating that the bank has no capacity for I/O objects of group $G_i$.

By appropriately setting $C_{ip}$ to zero, the assignment of a given I/O object to one or more different banks can be prevented. This also allows the imposition of range constraints where an I/O object is permitted in a subset of banks. For example a range constraint may allow I/O objects of group $G_i$ to use only banks 1, 2, and 3, but not banks 4, 5, or 6 of a given target programmable IC. In that case, the value of $C_{ip}$ for $p=4$, 5, 6 can be set to zero, e.g., $C_{i4}=C_{i5}=C_{i6}=0$.

Within steps 140-150, several different types of variables can be defined that can be used within the ILP formulation of the Select I/O problem disclosed herein. It should be appreciated that these steps are included for a complete understanding of the embodiments disclosed herein, but may be implemented at any of a plurality of points within FIG. 1.

One type of variable, an I/O object Assignment variable, can be a binary type variable. An I/O object Assignment variable can be denoted as $X_{jp}$, where j=1, ..., K and p=1, ..., N. Within the I/O object Assignment variables, N represents the total number of available banks on the target programmable IC and K represents the total number of I/O objects specified by the circuit design. If an I/O object j is assigned to a bank p then $X_{jp}=1$ otherwise, $X_{jp}=0$. While the total number of I/O object Assignment variables is defined by K*N, when a given bank p is incompatible with an I/O object j, then $X_{jp}=0$ and that instance of $X_{jp}$ can be removed from the list of independent variables.

The Select I/O problem involves determining the set of I/O object Assignment variables that satisfies all constraints and assigns I/O objects to appropriate banks. An ILP formulation of the Select I/O problem that relies only upon I/O object Assignment variables, without further independent variables to limit the combinatorial possibilities, would likely be too large to solve for a modern programmable IC, even using modern computational systems. For example, the total number of such constraints is on the order of K*K*N. For modern programmable ICs, this can translate into approximately $10^8$ constraints.

Accordingly, in step 140, Grouped I/O object Assignment Variables can be defined. Each Grouped I/O object Assignment Variable can be a binary type variable that helps to simplify the ILP formulation. Grouped I/O object Assignment Variables can be denoted as $X_{ijp}$ where i=1, ..., M, j=1, ..., N and p=1, ..., N. As noted, M represents the total number of groups for the circuit design, N represents the total number of available banks on the target programmable IC, and $N_i$ refers to the size of the set $\{O_{ij}\}$, where $\{O_{ij}\}$ represents the set of I/O objects that form the group $G_i$. Accordingly, $X_{ijp}=1$ if an I/O object $\{O_{ij}\}$ from a group $G_i$ is assigned to a bank $B_p$, otherwise, $X_{ijp}=0$. The total number of such variables will still be K*N, where K represents the total number of I/O objects specified by the circuit design.

In step 145, Bank Color Assignment Variables can be defined. Each Bank Color Assignment Variable can be defined as a binary variable. Bank Color Assignment Variables can be denoted as $Y_{ip}$, where i=1, ..., M with M representing the number of groups and p=1, ..., N with N representing the number of banks. Bank Color Assignment Variables indicate whether at least one I/O object from a group $G_i$ is assigned to a bank $B_p$. The Bank Color Assignment Variables function as utility variables which can simplify the ILP formulation discussed herein. As these variables are binary, the value of each can be 0 or 1 with the variables being defined by the relationship $0 \leq Y_{ip} \leq 1$. As per the discussion above, $Y_{ip}=0$ if $X_{ijp}=0$ for all j and $Y_{ip}=1$ if $X_{ijp}>0$ for at least one j.

In step 150, Bank Assignment Variables can be defined. Each Bank Assignment Variable can be a binary variable. Bank Assignment Variables can be denoted as $Z_{ip}$, where i=1, ..., M with M representing the number of groups and p=1, ..., N with N representing the number of banks. Bank Assignment Variables define whether a given bank $B_p$ is occupied. In other words, the Bank Assignment Variables indicate whether the selected bank holds at least one assigned I/O object. The variable $Z_{ip}=1$ if the bank $B_p$ has at least one assigned I/O object with I/O standard $S_i$ or an I/O standard compatible with $S_i$. Otherwise, $Z_{ip}=0$. The I/O standard indicates the $V_{ref}$ and $V_{cco}$ voltages that will be supplied to the bank, as well as which pins are reserved, which pins are set free, etc. From the above discussion, it can be seen that the Bank Assignment Variables can be defined according to the relationship $0 \leq Z_{ip} \leq 1$. As will be described in further detail, the embodiments disclosed herein allow the automatic choice of $Z_{ip}$ values that allow maximum flexibility for the given circuit design and target device.

In step 155, the total number of independent ILP variables can be reduced according to bank capacity. For example, if bank capacity $C_{ip}=0$, then no I/O objects from a Group $G_i$ can be assigned to a bank $B_p$. This leads to a result that for all I/O objects in the Group $G_i$, $X_{ijp}=0$, $Y_{ip}=0$, and $Z_{ip}=0$. When the value of such variables is determined, the variables can be removed from the list of independent variables of the ILP formulation. This reduces the complexity of the ILP formulation. Once removed, the list of independent variables can be re-indexed using the computed values for each variable removed from the list of independent variables.

A plurality of different constraints next can be defined to aid in solving the Select I/O problem. The constraints define relationships that must be observed or enforced when solving the Select I/O problem. Referring to step 160, one or more resource constraints can be defined. The resource constraints indicate that each I/O object may be assigned to one bank only. The resource constraints may be formulated as:

$$\sum_{p=1}^{N} X_{ijp} = 1,$$

where i=1, ..., M and j=1, ..., $N_i$. The total number of resource constraints will be K, e.g., one resource constraint for each I/O object. Thus, for a given i and j, only one variable out of the set $\{X_{ijp}\}$, where p=1, ..., N can be different from zero.

In step 165, one or more capacity constraints can be defined. Each bank can hold I/O objects from any groups as long as such groups are compatible. The total number of I/O objects assigned to a given bank, however, must not exceed the capacity of the bank. In other words, for each bank, the sum of contributions from all groups assigned to that bank must not exceed the capacity of the bank. The bank capacity depends upon the bank configuration. Since the bank configuration is not known in advance, the bank capacity can be set to be a linear function, e.g., a sum, of all possible capacities for all configurations. Subsequently, the additional restriction that a bank can be configured with only one configuration can be imposed. Such a restriction will mean that only one variable $Z_{ip}$ for a given value of p will be one and the rest will be zero. The relationship can be expressed as $$\sum_{i=1}^{M} \sum_{j=1}^{N_i} X_{ijp} \leq \sum_{i=1}^{M} C_{ip} Z_{ip},$$

where $C_{ip}$ indicates the minimum capacity of bank $B_p$ for all I/O standards compatible with the standard $S_i$. Since only one $Z_{ip}$ can be equal to 1 for a given bank p, only one of the $C_{ip}Z_{ip}$ terms in right hand side of the above expression can be non-zero. The total number of capacity constraints will be equal to N.

In step 170, one or more configuration constraints can be defined. The configuration constraints can exploit the binary nature of $Z_{ip}$. Each bank can be configured according to only one I/O standard. This means that, at most, only one of $Z_{ip}$ can be equal to one for a given bank. This relationship can be expressed as $$0 \leq \sum_{i=1}^{M} Z_{ip} \leq 1,$$

where p=1, ..., N. The total number of configuration constraints can be equal to N, the total number of banks. The configuration constraints determine the capacity of a bank as discussed herein. In association with the Bank Color Assignment Variables $Y_{ip}$, the Bank Assignment Variables $Z_{ip}$ allow the ILP solver to automatically choose the best possible configuration for each bank.

In step 172, one or more compatibility constraints can be defined. As discussed, only compatible I/O objects can be assigned to the same bank. Compatibility between different groups is defined by the BCM elements $A_{ij}$. These constraints can be expressed in terms the Bank Color Assignment Variables $Y_{ip}$. In one embodiment, the compatibility constraints can be expressed using the inequalities $Y_{ip}+Y_{jp} \leq 1+A_{ij}$ for all possible combinations of groups $G_i$ and $G_j$, where i,j=1, ..., M, as well as for all banks $B_p$, where p=1, ..., N.

Recall that $Y_{ip}$ indicates whether at least one I/O object from a group $G_i$ is assigned to a bank $B_p$. According to the compatibility constraint inequality, if $A_{ij}=1$, $Y_{ip}$ and $Y_{jp}$ each can equal one without violating the inequality. This means that the two groups are compatible. If, however, $A_{ij}=0$ then either $Y_{ip}$ or $Y_{jp}$, is forced to zero to maintain the inequality. The Bank Color Assignment Variable that is not forced to zero indicates the I/O standard that is included, or assigned to, the relevant bank. Cases where $A_{ij}=0$ for $Y_{ip}$ or $Y_{jp}$ represent non-trivial cases, e.g., two groups that cannot be assigned to the same bank. The total number of non-trivial compatibility constraints is design dependent and is equal to the total number of BCM elements that are equal to zero. Accordingly, the maximum number of such constraints will be M*M*N, where M is typically the order of 10.

In step 174, one or more relation constraints can be defined. The constraints described with reference to steps 160-172 act on groups of variables, but do not define mutual relationships among the variables. The relation constraints impose the mutual relationships needed to solve an ILP formulation of the Select I/O problem. The relation constraints can be expressed as a set of inequalities. The first relation constraint can be expressed as:

$$Y_{ip} \leq \sum_{j=1}^{N_i} X_{ijp} \leq N_i Y_{ip},$$

where i=1, ..., M and p=1, ..., N. The second relation constraint can be expressed as: $0 \leq Z_{ip} \leq Y_{ip}$, where i=1, ..., M and p=1, ..., N.

From the relation constraint $$Y_{ip} \leq \sum_{j=1}^{N_i} X_{ijp} \leq N_i Y_{ip},$$

it can be seen that if $Y_{ip}=0$ the only allowed value for each $X_{ijp}$ also is zero. Recall that the Group I/O object Assignment Variable $X_{ijp}$ indicates whether a given I/O object $\{O_{ij}\}$ from a group $G_i$ is assigned to a bank $B_p$. Thus, if $X_{ijp}=0$, no I/O objects of group $G_i$ have been assigned to bank $B_p$. Also, if $X_{ijp}=0$, then $Y_{ip}=0$. The constraint defines a linear relationship between $X_{ijp}$ and $Y_{ip}$.

The relation constraint $0 \leq Z_{ip} \leq Y_{ip}$ indicates that if $Y_{ip}=1$, then the value of $Z_{ip}$ can be 0 or 1. In other words, a configuration of bank $B_p$ to support a given group $G_i$ may result in that group being assigned to the bank. This is not required, however. Bank $B_p$, instead, can be configured with the I/O standard $S_i$ of some other compatible group $G_j$ e.g., where I/O standards $S_i$ and $S_j$ are compatible. That is, other compatible groups that require the same bank configuration can also be assigned to the bank $B_p$. In any case, the total number of relation constraints can be 2*N*M.

In step 176, integrality constraints can be defined. The integrality constraints simply require that all $Z_{ip}$, $Y_{ip}$, and $X_{ijp}$ be binary variables.

Beginning in step 178 and continuing through step 182, optional constraints, or relationships, can be imposed. These constraints deal with location, range, and RPMs. In step 178, location constraints optionally can be imposed. Location constraints can be employed when one or more I/O objects from a given group $G_i$ are assigned to specific locations of a bank $B_p$. The imposition of location constraints is discussed in greater detail with reference to FIG. 2. In step 180, range constraints optionally can be imposed. Range constraints can be employed when one or more I/O objects are restricted to being assigned to only one subset of banks and, thus, are forbidden from being assigned to other subsets of banks. The imposition of range constraints is discussed in greater detail with reference to FIG. 3.

In step 182, RPM integrity constraints optionally can be imposed. RPM integrity constraints are imposed when a circuit design incorporates one or more RPM groups that can only be assigned to a given bank $B_p$ as a whole. Such RPM groups can be formed according to the RPM constraint type (RPMType) as discussed with reference to I/O standards. The RPM integrity constraint can be expressed as $X_{ijp}=X_{ikp}$, where p=1, ..., N for all I/O block pairs $O_{ij}$ and $O_{ik}$ that are part of the same RPM. The total number of RPM integrity constraints depends on the number of RPM groups and the size of the RPM groups. Accordingly, the total number of RPM integrity constraints will be design dependent, although typically a relatively small number.

In step 184, feasibility constraints can be imposed. For a solution to be feasible, the total number of occupied banks must not exceed the total number of banks available on the programmable IC. This feasibility constraint can be expressed as $$\sum_{i=1}^{M} \sum_{p=1}^{N} Z_{ip} \leq N.$$

For each bank, only one $Z_{ip}$ can be different from zero, as follows from the configuration constraint, and the total number of occupied banks, where $Z_{ip}=1$ should not be larger than N.

In step 186, inter-bank distances between the different banks available on the target programmable IC can be computed. The distances can be represented in the form of a matrix where a distance $D_{pq}$ reflects the distance between a bank $B_p$ and a bank $B_q$. In one embodiment, the distance between a set of two banks can be expressed as the Manhattan distance measured from the mid-point of each of the two banks. As known, the Manhattan distance reflects the distance between the two points taken along right angles. The distances, however, can be measured in any of a variety of different ways. The distances may be predetermined or precomputed for the target programmable IC. Accordingly, the inter-bank distances, also referred to as the inter-bank distance matrix, may be reused for other circuit designs and Select I/O problems using the same target programmable IC.

It should be appreciated that while distance is used as one type of parameter upon which the ILP formulation may be optimized or evaluated in terms of proximity to the reference solution, other parameters may be used. For example, the variable $D_{pq}$ can represent any of a variety of different measures of proximity that may be incorporated into the ILP formulation, e.g., wire length or timing. The measure of proximity can be used to determine a cost metric. The "cost metric" can refer to a penalty that can be imposed when the bank to which a selected I/O object of the circuit design is assigned in the ILP formulation differs from the bank to which the same selected I/O object is assigned in the infeasible reference solution.

The cost metric can depend, vary, or be calculated according to any of a variety of measurable differences between the bank assignment of the ILP solution and the bank assignment of the reference solution. For example, the cost metric can depend upon the difference in wire length between the bank assignment of the ILP solution and the bank assignment of the reference solution for the selected I/O object. In illustration, the difference between the length of the route, e.g., the wire length of the route, measured from some internal reference point in the circuit design to the assigned bank in the reference solution and the length of the route from the same reference point to the assigned bank in the ILP formulation can be determined and used as the cost metric.

In another example, the cost metric can depend upon the difference in estimated timing between the bank assignment of the ILP solution and the bank assignment of the reference solution for the selected I/O object. Each cost metric can depend upon a difference in timing that results from assigning the selected I/O object to a bank of the programmable IC that is different from the bank to which the selected I/O object is assigned in the reference solution.

In any case, when a selected I/O object is assigned to a bank in the ILP formulation and the selected I/O object, e.g., the same I/O object, is assigned to the same bank in the reference solution, the penalty imposed using the cost metric will be zero. The more the assigned location of the selected I/O object within the ILP formulation differs from the location of the selected I/O object in the reference solution, the greater the penalty imposed. The penalty can be scaled according to difference in distance, wire length, timing, etc. of the two different bank assignments for the selected I/O object.

In step 188, a representation of the reference solution can be determined and stored. The reference solution specifying an assignment of I/O objects to banks can be expressed in terms of the binary variables $R_{ijp}$. The variables $R_{ijp}$, can indicate that for each I/O object j belonging to a group $G_i$, there is only one bank $B_p$, for which $R_{ijp}=1$. $R_{ijp}$ will be zero for all other banks for the I/O object j belonging to a group $G_i$. $R_{ijp}$ will be equal to 1 if the I/O object j of group i is assigned to bank q in the reference solution. In other words, the variables $R_{ijp}$, representing the reference solution may be generated manually, e.g., be user-defined, or generated automatically using a software utility capable of reading and/or parsing a programmatic description of a circuit design, e.g., a netlist or a hardware description language description of the reference circuit design.

In step 190, an objective function for solving the Select I/O problem using ILP can be defined. An objective function can be formulated as a linear combination of independent variables with coefficients described within this specification. These coefficients can be computed using the inter-bank distances matrix and the reference solution $R_{ijp}$. The ILP objective function, denoted as F, can be expressed as:

$$F = \min\left(\sum_{i=1}^{M} \sum_{j=1}^{N_i} \sum_{p=1}^{N} \sum_{q=1}^{N} X_{ijp} D_{pq} R_{ijq}\right).$$

If the total number of utilized banks is not larger than the total number of available banks N on the target device, the ILP solution will be feasible, e.g., as no constraints were violated in minimizing the function.

In this embodiment, the cost metric can depend upon distance. The variables $D_{pq}$ can represent the distance between a bank p and a bank q on the programmable IC. As noted, in other embodiments, the variables $D_{pq}$ can represent wire length difference, timing difference, etc. between bank p and bank q on the programmable IC. In any case, since variables $R_{ijq}$ are known in advance, only one value per bank is 1. The variables $D_{pq}$ are pre-computed distances between banks resulting in the function F being a linear function of independent variables $X_{ijp}$. Thus, the conditions for using an ILP technique are satisfied. The summation of banks q will be restricted to 1 term only since only one of the set $R_{ijq}$ and $X_{ijp}$ can be different from zero. The absolute minimum of the function F will occur when $D_{pq}$ for a given p and q is zero and a feasible ILP solution assigns I/O object $O_{ij}$ to the same bank as the reference solution.

In step 192, the ILP problem can be solved. The ILP solution can be determined using any of a variety of commercially available, software-based, ILP solvers. Available ILP solvers can include, but are not limited to, LP_Solve, which is a free solver. Other free and commercial solvers also are available. Again, referring to the example, the solver, or an analysis of the constraints set forth herein, can indicate whether a feasible solution exists for the I/O assignment problem.

In step 194, a determination can be made as to whether a feasible solution was determined using the ILP solver. If so, the method can proceed to step 198 where the solution can be output. As noted, the solution will specify an assignment of I/O objects of the circuit design to banks of the programmable IC. When a solution is obtained, e.g., a feasible solution exists, that solution will be the closest feasible solution that can be determined as compared to the reference solution using the cost metric described herein. As used herein, "outputting" and/or "output" can mean, for example, writing to a file, storing in memory, writing to a user display or other output device, playing audible notifications, sending or transmitting to another system, exporting, or the like. When no feasible solution exists, the method can continue to step 196, where a report can be generated and output that explains why the solution is infeasible.

Figure 2:
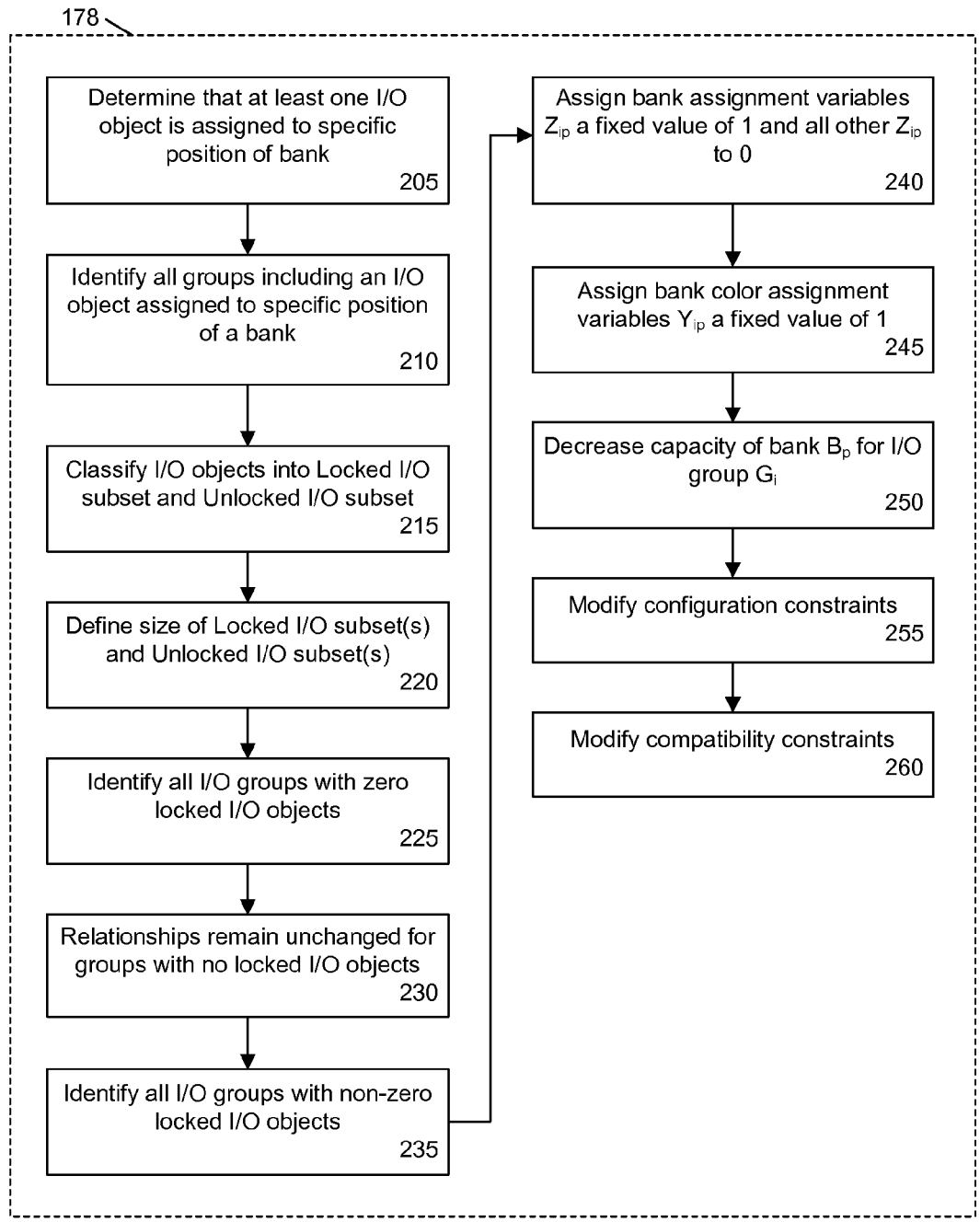
FIG. 2 is a flow chart illustrating a method of implementing location constraints in accordance with another embodiment of the present invention.

FIG. 2 is a flow chart illustrating a method of implementing location constraints in accordance with another embodiment of the present invention. More particularly, FIG. 2 illustrates an example of an implementation for step 178 of FIG. 1. As noted, location constraints can be imposed when one or more I/O objects from a given group $G_i$ are assigned to specific locations of a bank $B_p$. Accordingly, in step 205, a determination can be made that at least one I/O object of the circuit design has been assigned to a specific position of a bank of the target programmable IC. This can result from a clock I/O object needing to be assigned to a specific location, or site, within a bank that is reserved for clock resources or as a result of a user-specified constraint relating to a clock I/O object or a regular I/O object. In step 210, all groups $G_i$ that include at least one I/O object that has been assigned to a specific location within a bank can be identified.

In step 215, for each group identified in step 210, the I/O objects within such groups can be classified into two disjoint subsets. In particular, each I/O object of each group can be classified as a Locked I/O or an Unlocked I/O. I/O objects that are assigned to a particular location within a bank can be classified as belonging to the Locked I/O subset. Conversely, I/O objects that are not assigned to particular locations within a bank can be classified as belonging to the Unlocked I/O subset.

In step 220, the size of each subset for each group can be defined. The size is an indication of the number of I/O objects included within the subset. For each group identified in step 210, the number of I/O objects classified as being within the Unlocked I/O subset can be denoted as NU. The number of I/O objects classified as being within the Locked I/O subset can be denoted as NL. Both NU and NL can be defined as being equal to zero or a positive integer.

In step 225, all groups with NL=0 can be identified. In step 230, the groups identified in step 225 can remain unchanged. More particularly, any relationships defined as discussed with reference to FIG. 1 can remain intact for groups with NL=0. In step 235, all groups with NL>0 can be identified. For such groups, the relationships described with reference to FIG. 1 can be modified. Steps 240-260 describe, in greater detail, the modifications to the relationships for groups with NL>0.

In step 240, the Bank Assignment Variables, denoted as $Z_{ip}$, for groups with NL>0, can be changed to have a fixed value of one. As noted, $Z_{ip}$ indicates whether a bank $B_p$ is occupied with at least one I/O object. Since the bank $B_p$ includes at least one I/O object, in particular the I/O object specifically assigned to the bank, $Z_{ip}$ has this fixed value of one.

In step 245, the Bank Color Assignment Variables, denoted as $Y_{ip}$, for groups with NL>0 can be changed to have a fixed value of one. $Y_{ip}$ indicates whether at least one I/O object from a group $G_i$ has been assigned to a bank B. Since the bank $B_p$ has at least one I/O object from the group $G_i$, e.g., the I/O object assigned a particular location within bank $B_p$, $Y_{ip}$ is set equal to one.

In step 250, the capacity of the bank $B_p$ for group $G_i$ can be decreased by a quantity $L_{ip}$, which represents the number of I/O objects from the group $G_i$ that are locked to the bank $B_p$. Thus, the capacity for a bank $B_p$ can be expressed as $C_{ip}-L_{ip}$.

In step 255, the configuration constraints described with reference to step 170 of FIG. 1 can be modified. In particular, the Bank Assignment Variables $Z_{ip}$ can be modified such that $Z_{jp}=0$ for all $j \ne i$. In step 260, the compatibility constraints described with reference to step 172 of FIG. 1 can be modified. The Bank Color Assignment Variables $Y_{jp}$ can be modified such that $Y_{jp}=0$ if the group $G_j$ is not compatible with $G_i$.

In general, if multiple I/O objects are locked to the same bank, the groups associated with such I/O objects should be compatible. As illustrated in FIG. 2, each locked I/O object effectively decreases the total complexity of the problem by reducing the number of independent variables and regular constraints. This leads to a less complex ILP problem and solution process.

Figure 3:
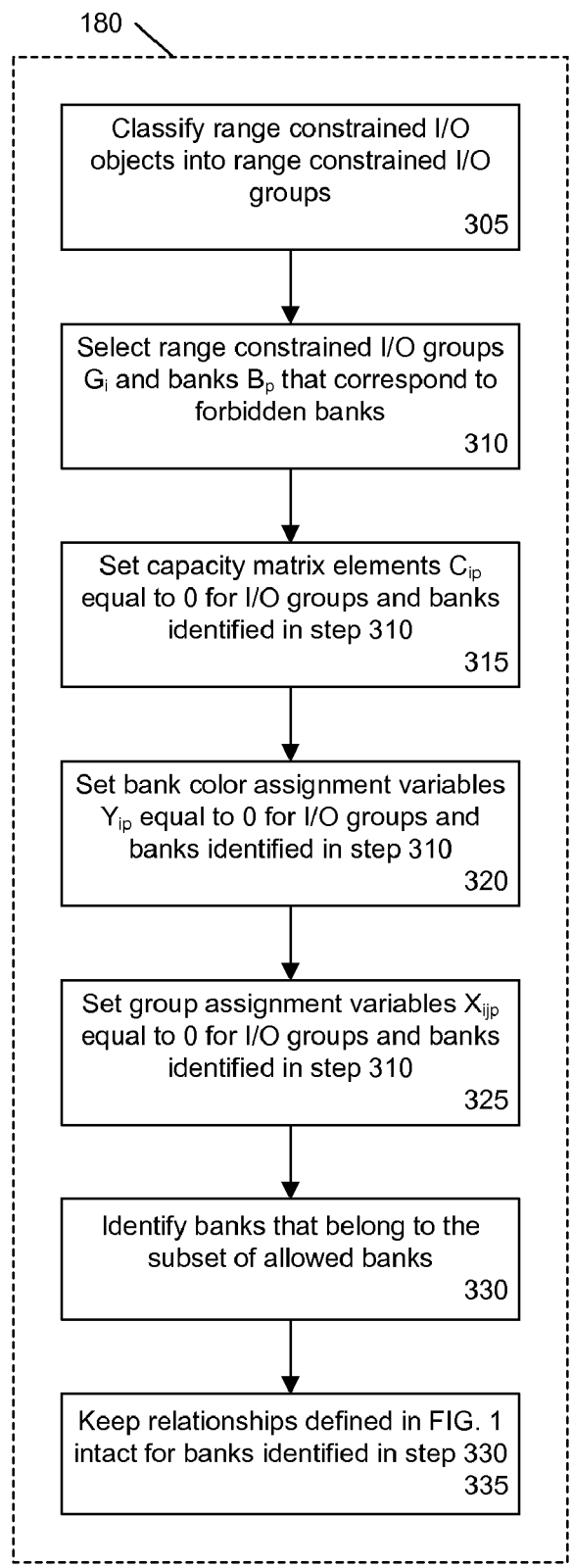
FIG. 3 is a flow chart illustrating a method of implementing range constraints in accordance with another embodiment of the present invention.

FIG. 3 is a flow chart illustrating a method of implementing range constraints in accordance with another embodiment of the present invention. More particularly, FIG. 3 illustrates an example of an implementation of step 180 of FIG. 1. As discussed, range constraints can be employed when one or more I/O objects are restricted to being assigned to only one subset of banks and, thus, are forbidden from being assigned to other subset(s) of banks.

In step 305, all I/O objects that are range constrained can be grouped into range constrained groups. Range constrained groups can be distinguished by the parameter RCType as well as by other attributes as discussed with reference to I/O standards in FIG. 1. In step 310, all range constrained groups $G_i$ can be selected as well as all banks $B_p$ that belong to the subset of forbidden banks. Various parameters can be modified for these groups and banks as will be described with reference to steps 315-325.

Recalling that elements $C_{ip}$ of the capacity matrix indicate the maximum number of I/O objects from a group $G_i$ that can be assigned to a bank $B_p$, in step 315, the elements of the capacity matrix that correspond to the groups and banks identified in step 310 can be set equal to zero. Since these banks are unable to receive I/O objects from the identified groups, the capacity of each bank concerning the identified groups is set to zero.

In step 320, the Bank Color Assignment Variables $Y_{ip}$ corresponding to the groups and banks identified in step 310 can be set equal to zero. The Bank Color Assignment Variables $Y_{ip}$ define whether at least one I/O object from a group $G_i$ is assigned to a bank $B_p$. In step 325, the Grouped I/O object Assignment Variables $X_{ijp}$ corresponding to the groups and banks identified in step 310 can be set equal to zero. Forcing these variables to zero effectively restricts the range of available banks to which range constrained I/O objects, and thus range constrained groups, can be assigned.

In step 330, all banks that belong to the subset of allowed banks can be identified. In step 335, the relationships that were defined with reference to FIG. 1 for the allowed banks can remain intact. Other I/O objects compatible with group $G_i$ can be assigned to the same subset of banks. By allowing the elements of the capacity matrix to take on different values including zero, range constraints can be accommodated. Moreover, imposition of range constraints can simplify the Select I/O problem in that the number of independent variables is reduced.

Figure 4:
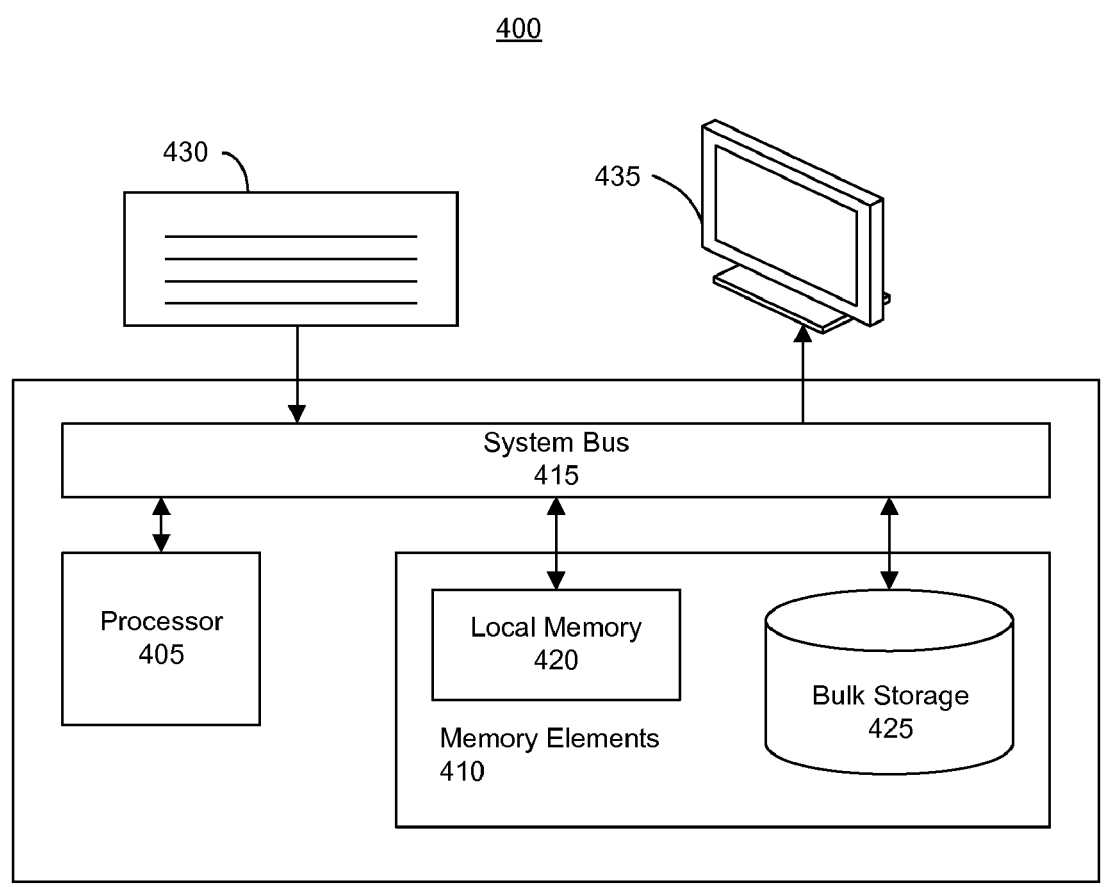
FIG. 4 is a block diagram illustrating an exemplary data processing system that can be used in accordance with another embodiment of the present invention.

FIG. 4 is a block diagram illustrating an exemplary data processing system 400, e.g., a computer or computer system, suitable for storing and/or executing program code that can be used to implement one or more embodiments disclosed within this specification. Data processing system 400 can include at least one processor 405 coupled directly or indirectly to memory elements 410 through a system bus 415. The memory elements 410 can include a local memory 420 employed during actual execution of the program code, bulk storage 425, and cache memories (not shown) which provide temporary storage of at least some program code in order to reduce the number of times code must be retrieved from bulk storage during execution.

Input/output or I/O devices such as, for example, a keyboard 430, a display 435, pointing devices (not shown), etc., can be coupled to data processing system 400 either directly or through intervening I/O controllers (not shown). Network adapters (not shown) may also be coupled to data processing system 400 to enable data processing system 400 to become coupled to other data processing systems or remote printers or storage devices through intervening private or public networks. Modems, cable modems, and Ethernet cards are just a few of the currently available types of network adapters.

The embodiments described herein present a technique for solving Select I/O placement problems using an ILP-based technique. The present invention addresses Select I/O placement problems with respect to constraints relating to mixed-capacity banks, I/O objects having location and/or range constraints, as well as constraints relating to the use of RPMs within a circuit design. Optimization, such as proximity, whether in terms of distance, wire length, and/or timing, can be incorporated to achieve an assignment of I/O objects to banks of a programmable IC that closely tracks a reference solution with respect to the selected cost metric. The resulting assignment of I/O objects will be a feasible solution to the Select I/O placement problem.

The flowcharts in the figures illustrate the architecture, functionality, and operation of possible implementations of systems, methods and computer program products according to various embodiments of the present invention. In this regard, each block in the flowcharts may represent a module, segment, or portion of code, which comprises one or more portions of computer-usable program code that implements the specified logical function(s).

It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It also should be noted that each block of the flowchart illustrations, and combinations of blocks in the flowchart illustrations, can be implemented by special purpose hardware-based systems that perform the specified functions or acts, or combinations of special purpose hardware and computer instructions.

Embodiments of the present invention can be realized in hardware, software, or a combination of hardware and software. The embodiments can be realized in a centralized fashion in one data processing system or in a distributed fashion where different elements are spread across several interconnected data processing systems. Any kind of data processing system or other apparatus adapted for carrying out the methods described herein is suited. A typical combination of hardware and software can be a general-purpose computer system with a computer program that, when being loaded and executed, controls the computer system such that it carries out the methods described herein.

Embodiments of the present invention further can be embedded in a computer program product, which comprises all the features enabling the implementation of the methods described herein. The computer program product can include a computer-usable or computer-readable medium having computer-usable program code which, when loaded in a computer system, causes the computer system to perform the functions described herein. Examples of computer-usable or computer-readable media can include, but are not limited to, optical media, magnetic media, computer memory, one or more portions of a wired or wireless network through which computer-usable program code can be propagated, or the like.

The terms "computer program," "software," "application," "computer-usable program code," variants and/or combinations thereof, in the present context, mean any expression, in any language, code or notation, of a set of instructions intended to cause a system having an information processing capability to perform a particular function either directly or after either or both of the following: a) conversion to another language, code or notation; b) reproduction in a different material form. For example, a computer program can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, although not necessarily directly, and not necessarily mechanically, e.g., communicatively linked through a communication channel or pathway or another component or system.

The embodiments disclosed herein can be embodied in other forms without departing from the spirit or essential attributes thereof. Accordingly, reference should be made to the following claims, rather than to the foregoing specification, as indicating the scope of the various embodiments of the present invention.

What is claimed is:

1. A method of assigning a plurality of input/output (I/O) objects of a circuit design to configurable banks of an integrated circuit (IC) using integer linear programming, the method comprising:
   storing a plurality of constraints that depend upon a plurality of variables, wherein the plurality of constraints regulate assignment of each of the plurality of I/O objects to banks of the integrated circuit;
   storing a linear function that depends upon the plurality of constraints and a plurality of cost metrics, wherein each cost metric imposes a penalty when a selected I/O object of the circuit design is assigned to a bank of the integrated circuit that is different from a bank to which the selected I/O object is assigned within a reference solution that is infeasible;
   determining, using a processor, a result indicating whether a feasible solution exists for assignment of the plurality of I/O objects of the circuit design to banks of the target programmable IC by minimizing the linear function subject to the plurality of constraints; and
   outputting the result.

2. The method of claim 1, wherein storing a plurality of constraints further comprises assigning each of the plurality of I/O objects to a group according to an I/O standard implemented by each I/O object, wherein only I/O objects of compatible groups are assigned to a same bank of the integrated circuit.

3. The method of claim 2, further comprising determining a plurality of grouped I/O object assignment variables, wherein each of the plurality of grouped I/O object assignment variables is a binary variable representing one selected I/O object and the group to which the one selected I/O object is assigned, wherein each grouped I/O object assignment variable indicates whether the one selected I/O object represented by the grouped I/O object assignment variable is assigned to a selected bank of the integrated circuit.

4. The method of claim 3, further comprising, when the result indicates a feasible solution, assigning each of the plurality of I/O objects to a bank of the integrated circuit according to the plurality of grouped I/O object assignment variables.

5. The method of claim 1, wherein storing a linear function further comprises selecting each cost metric to depend upon distance between the bank of the integrated circuit to which the selected I/O object for the circuit design is assigned and the bank of the integrated circuit to which the selected I/O object is assigned in the reference solution.

6. The method of claim 1, further comprising selecting the linear function to be $$\sum_{i=1}^{M} \sum_{j=1}^{N_i} \sum_{p=1}^{N} \sum_{q=1}^{N} X_{ijp} D_{pq} R_{ijq},$$

wherein $X_{ijp}$ is a binary variable indicating whether an I/O object j that is assigned to a group i is assigned to a bank p of the integrated circuit, $D_{pq}$ is a constant that represents a distance between a bank p and a bank q of the integrated circuit, $R_{ijq}$ is a binary variable that indicates whether I/O object j of group i is assigned to bank q in the reference solution, $N_i$ is the size of a set of I/O objects assigned to a group i, M is a total number of groups, and N is a total number of banks on the integrated circuit.

7. A method of assigning a plurality of input/output (I/O) objects of a circuit design to banks of a programmable integrated circuit (IC) using integer linear programming, the method comprising:
  storing a plurality of constraints that depend upon a plurality of variables, wherein the plurality of constraints regulate assignment of each of the plurality of I/O objects to banks of the programmable IC;
  selecting a reference solution specifying assignments of I/O objects to banks of the programmable IC, wherein the reference solution is infeasible;
  storing a linear function that depends upon the plurality of constraints and cost metrics that penalize assignment of I/O objects of the circuit design to banks of the programmable IC that differ from the assignment of I/O objects to banks of the programmable IC within the reference solution;
  determining, using a processor, that a feasible solution exists for assignment of the plurality of I/O objects of the circuit design to banks of the programmable IC when the linear function is minimized while satisfying each of the plurality of constraints; and
  when a feasible solution exists, outputting the feasible solution specifying an assignment of each of the plurality of I/O objects to banks of the programmable IC.

8. The method of claim 7, wherein storing a linear function further comprises selecting each cost metric to depend upon distance between the bank of the programmable IC to which a selected I/O object of the circuit design is assigned and the bank of the programmable IC to which the selected I/O object is assigned in the reference solution.

9. The method of claim 7, wherein storing a linear function further comprises selecting each cost metric to depend upon a difference between a wire length of a route beginning at a selected location within the programmable IC and ending at the bank of the programmable IC to which a selected I/O object of the circuit design is assigned and a wire length of a route beginning at the selected location within the programmable IC and ending at the bank of the programmable IC to which the selected I/O object is assigned in the reference solution.

10. The method of claim 7, wherein storing a linear function further comprises selecting each cost metric to depend upon a difference in timing that results from assigning a selected I/O object to a bank of the programmable IC that is different from the bank to which the selected I/O object is assigned in the reference solution.

11. The method of claim 7, wherein storing a plurality of constraints further comprises assigning each of the plurality of I/O objects to a group according to an I/O standard implemented by each I/O object, wherein only I/O objects of compatible groups are assigned to a same bank of the programmable IC.

12. The method of claim 11, further comprising defining a plurality of grouped I/O object assignment variables $X_{ijp}$, wherein each of the plurality of grouped I/O object assignment variables is a binary variable representing one selected I/O object j and the group i to which the one selected I/O object is assigned, wherein each grouped I/O object assignment variable indicates whether the one selected I/O object represented by the grouped I/O object assignment variable is assigned to a selected bank p of the programmable IC.

13. The method of claim 12, further comprising, when a feasible solution exists, assigning each of the plurality of I/O objects to a bank of the programmable IC according to the plurality of grouped I/O object assignment variables.

14. The method of claim 12, further comprising selecting the linear function to be $$\sum_{i=1}^{M} \sum_{j=1}^{N_i} \sum_{p=1}^{N} \sum_{q=1}^{N} X_{ijp} D_{pq} R_{ijq},$$

wherein $D_{pq}$ is a constant that represents a distance between a bank p and a bank q of the programmable IC, $R_{ijq}$ is a binary variable that indicates whether I/O object j of group i is assigned to bank q in the reference solution, $N_i$ is the size of a set of I/O objects assigned to a group i, M is a total number of groups, and N is a total number of banks on the programmable IC.

15. A computer program product comprising:
  a non-transitory computer-usable medium comprising computer-usable program code that assigns a plurality of input/output (I/O) objects of a circuit design to banks of a programmable integrated circuit (IC) using integer linear programming, the computer-usable medium comprising:
  computer-usable program code that stores a plurality of constraints that depend upon a plurality of variables, wherein the plurality of constraints regulate assignment of each of the plurality of I/O objects to banks of the programmable IC;
  computer-usable program code that stores a linear function that depends upon the plurality of constraints and a plurality of cost metrics, wherein each cost metric imposes a penalty when a selected I/O object of the circuit design is assigned to a bank of the programmable IC that is different from a bank to which the selected I/O object is assigned within a reference solution that is infeasible;
  computer-usable program code that determines a result indicating whether a feasible solution exists for assignment of the plurality of I/O objects of the circuit design to banks of the programmable IC by minimizing the linear function subject to the plurality of constraints; and
  computer-usable program code that outputs the result.

16. The computer program product of claim 15, wherein the computer-usable program code that stores a plurality of constraints further comprises computer-usable program code that assigns each of the plurality of I/O objects to a group according to an I/O standard implemented by each I/O object, wherein only I/O objects of compatible groups are assigned to a same bank of the programmable IC.

17. The computer program product of claim 16, further comprising computer-usable program code that determines a plurality of grouped I/O object assignment variables, wherein each of the plurality of grouped I/O object assignment variables is a binary variable representing one selected I/O object and the group to which the one selected I/O object is assigned, wherein each grouped I/O object assignment variable indicates whether the one selected I/O object represented by the grouped I/O object assignment variable is assigned to a selected bank of the programmable IC.

18. The computer program product of claim 17, further comprising computer-usable program code that, when the result indicates a feasible solution, assigns each of the plurality of I/O objects to a bank of the programmable IC according to the plurality of grouped I/O object assignment variables.

19. The computer program product of claim 15, wherein the computer-usable program code that stores a linear function further comprises computer-usable program code that selects each cost metric to depend upon a distance between the bank of the programmable IC to which the selected I/O object for the circuit design is assigned and the bank of the programmable IC to which the selected I/O object is assigned in the reference solution.

20. The computer program product of claim 15, further comprising computer-usable program code that selects the linear function to be $$\sum_{i=1}^{M} \sum_{j=1}^{N_i} \sum_{p=1}^{N} \sum_{q=1}^{N} X_{ijp} D_{pq} R_{ijq},$$

wherein $X_{ijp}$ is a binary variable indicating whether an I/O object j that is assigned to a group i is assigned to a bank p of the programmable IC, $D_{pq}$ is a constant that represents a distance between a bank p and a bank q of the programmable IC, $R_{ijq}$ is a binary variable that indicates whether I/O object j of group i is assigned to bank q in the reference solution, $N_i$ is the size of a set of I/O objects assigned to a group i, M is a total number of groups, and N is a total number of banks on the programmable IC.

\* \* \* \* \*